(12) United States Patent
Goethals

(10) Patent No.: US 7,346,749 B2
(45) Date of Patent: Mar. 18, 2008

(54) METHOD FOR STORING REGISTER PROPERTIES IN A DATASTRUCTURE AND RELATED DATASTRUCTURE

(75) Inventor: Dirk George Cyriel Goethals, Zwijndrecht (BE)

(73) Assignee: ALCATEL, Paris (FR)

( * ) Notice: Subject to any disclaimer, the term of this patent is extended or adjusted under 35 U.S.C. 154(b) by 249 days.

(21) Appl. No.: 10/692,681

(22) Filed: Oct. 27, 2003

(65) Prior Publication Data

US 2004/0153820 A1 Aug. 5, 2004

(30) Foreign Application Priority Data

Oct. 28, 2002 (EP) .................................. 02292677

(51) Int. Cl.
*G06F 12/00* (2006.01)
(52) U.S. Cl. ...................................... 711/156
(58) Field of Classification Search ............... 707/1, 707/100; 711/115, 117; 714/100, 724; 716/1; 717/120, 124, 1, 128; 702/117; 703/13–28
See application file for complete search history.

(56) References Cited

U.S. PATENT DOCUMENTS

| | | | |
|---|---|---|---|
| 4,450,560 A | 5/1984 | Conner | |
| 5,243,274 A | 9/1993 | Kelsey et al. | |
| 5,812,416 A * | 9/1998 | Gupte et al. | 716/2 |
| 6,003,150 A | 12/1999 | Stroud et al. | |
| 6,102,963 A * | 8/2000 | Agrawal | 716/17 |
| 6,327,692 B1 * | 12/2001 | Brown | 716/1 |
| 6,336,209 B1 * | 1/2002 | Nishihara et al. | 716/17 |
| 6,353,921 B1 * | 3/2002 | Law et al. | 716/17 |

OTHER PUBLICATIONS

T. Yamaguchi et al, "An Efficient Method for Compressing Test Data", Proceedings of the International Test Conference, ITC '97. Washington, DC, Nov. 1-6, 1997, International Test Conference, NY, IEEE, vol. Conf. 28, pp. 79-88, XP000800314.

* cited by examiner

*Primary Examiner*—Reginald Bragdon
*Assistant Examiner*—Thanh D. Vo
(74) *Attorney, Agent, or Firm*—Sughrue Mion, PLLC

(57) ABSTRACT

The present invention relates to a method for storing register properties of a hardware device having heterogeneous memory in a datastructure. This hardware device is built according to a structure of modules and dependent sub-modules wherein the register properties correspond to register properties of the modules and sub-modules. This method comprises the step of storing the register properties in a data-structure according to the structure of the hardware device and the register properties are arranged in an array for each module or dependent sub-module.

10 Claims, 5 Drawing Sheets

| Address | Register |
|---|---|
| 0 .. X | unused |
| X | Table_TableEntry0_Field1 |
| X+1 ... X+7 | unused |
| X+8 | Table_TableEntry0_Field2 |
| X+9 ... X+11 | unused |
| X+12 | Table_TableEntry0_Buffer0 |
| X+13 | Table_TableEntry0_Buffer1 |
| X+14 ... X+20 | ... |
| X+21 | Table_TableEntry0_Buffer9 |
| X+22 | Table_TableEntry1_Field1 |
| X+23 ... X+29 | unused |
| X+30 | Table_TableEntry0_Field2 |
| X+31 ... X+33 | unused |
| .... | ... |
| X+154 | Table_TableEntry6_Buffer9 |
| X+155 | Active |
| X+156 ... X+Y+156 | unused |
| X+Y+157 | ExtraStuff_Field3 |
| X+Y+158 | ExtraStuff_Buffer0 |
| X+Y+159 | ExtraStuff_Buffer1 |
| X+Y+160 | ExtraStuff_Buffer2 |
| X+Y+161 | ExtraStuff_Buffer3 |
| X+Y+162 | ExtraStuff_Buffer4 |

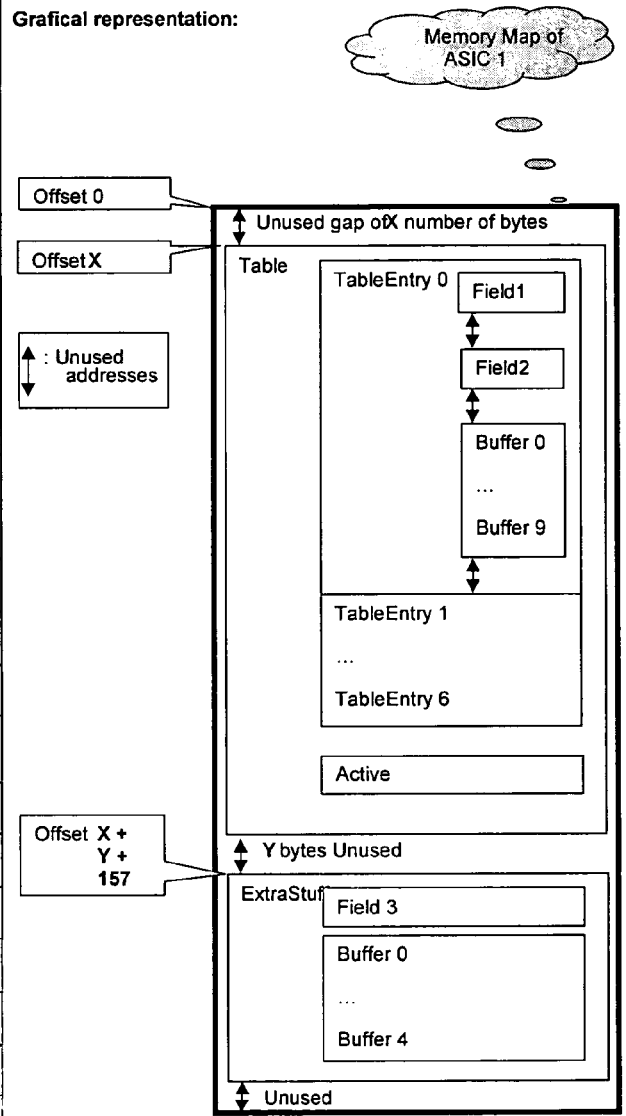

FIG.3

| | LChild | RBroth | Offset | Size of | RptNbr | InitValue | RW | URW | RR |
|---|---|---|---|---|---|---|---|---|---|
| 0 | 1 | 0 | 0 | Asic 0 | 1 | | | | |
| 1 | 2 | 7 | | Table | 1 | | | | |
| 2 | 3 | 6 | | TableEntry | 7 | | | | |
| 3 | 0 | 4 | | Field1 | 1 | | | | |
| 4 | 0 | 5 | | Field2 | 1 | | | | |
| 5 | 0 | 0 | | Buffer | 10 | | | | |
| 6 | 0 | 0 | | Active | 1 | | | | |
| 7 | 8 | 0 | | ExtraStuff | 1 | | | | |
| 8 | 0 | 9 | | Field3 | 1 | | | | |
| 9 | 0 | 0 | | Buffer | 5 | | | | |

FIG.5

METHOD FOR STORING REGISTER PROPERTIES IN A DATASTRUCTURE AND RELATED DATASTRUCTURE

BACKGROUND OF THE INVENTION

Field of the Invention

The present invention relates to a method for storing register properties of a hardware device having a heterogeneous memory in a datastructure as described in the preamble of claim 1 and a data structure for holding register properties of a hardware device having a heterogeneous memory as described in the preamble of claim 2.

Such a method and data-structure already are known in the art in test-systems including a test device for executing access tests on Application specific integrated circuits, further referred to as ASICs, that are mounted on a Printed Circuit Board and coupled to a micro-processor. Such a system is called an embedded hardware application. These, before mentioned, access tests consist of tests on the interconnections between a host microprocessor and its peripheral devices such as ASICs in this so-called embedded hardware application.

In such embedded hardware applications, ASICs and RAMs are mapped to a given address range, i.e. the processor can access them through memory access in the given address range. In other words, they are memory mapped.

ASICs typically have a heterogeneous memory-map as opposite to the homogenous memory map of RAM. With RAMs, all address in the given range are mapped to a different storage location in the RAM, each storage location has the same amounts of accessible bits and all of them have the same property (e.g. all bits are read/writable).

ASICs, on the other hand, have addresses in the given range that are not mapped to a register in the ASIC. (A storage location in the ASIC is typically called a register.) These are the so-called memory holes, wherein any access to those holes typically leads to unpredictable results. Furthermore, ASICs registers often differ in width from one address location to the other. The initial value (value after reset) of ASICs registers can vary from one address to the other.

Finally, ASICs registers do have different properties. These register properties are defined by the property of each bit in the register. At bit-level following properties are defined, a register may consist out of a mixture of these bit properties:

read writable bits where the processor can set the value, and read its setting, the read only bits wherein the processor can only read its setting, and can't change it and at last the read-reset bit where the hardware clears this bit after any read access of the processor.

To be able to apply an algorithm, such as an access test e.g. in a test system, that makes abstraction from the properties of an ASIC, one needs a data-structure holding the properties of that ASIC. Currently this is performed in a huge array. For each address of the ASICs address range, an entry is foreseen in this array. Each entry holds the properties of the register at the given address.

In such a test-system a data structure is used wherein each address in the range of the ASIC's memory space, is mapped to an entry in an array of register properties. In that way, the device properties of a device are represented by the array, i.e. the memory map.

Device properties of an ASIC to be tested are stored in a memory map. The storage of these device properties in the arrays of the memory map, requires a large memory space as all data is stored sequentially for each address of the ASIC, to be tested. Moreover, this memory map of a device is often unstructured with specific register properties and besides containing unused addresses.

Hence, it is disadvantageous that a large memory storage space is required to store all device properties due to the structure of such a memory map and moreover it is even more disadvantageous because due to the format and the distribution of the device properties necessary the retrieval-time of the data is substantially large.

SUMMARY OF INVENTION

An object of the present invention is to provide a datastructure of the above known type but wherein the data representing the device properties of the ASIC to be tested is stored in a more efficient manner.

According to the invention, this object is achieved by the method for storing register properties as described in claim 1 and the data structure as described in claim 2.

Indeed, by arranging the register properties of the hardware device having heterogeneous memory in a structure according to the structure of the hardware device wherein the register properties are arranged in an array for each module or dependent sub-module all essential data, i.e. all data corresponding to the modules and corresponding sub-modules is incorporated in the data structure without leaving open spaces. In this way only all relevant data i.e. the device properties are incorporated in a very structured manner in the database. It is to be noted that this ASIC structure and the corresponding data structure may be tree-structured. A further advantage of this manner of structuring and storing the data in this structure is that it facilitates the easy and fast retrieval of present device properties. Such hardware device may be any hardware device having a heterogeneous memory such as an Application Specific Integrated Circuit (ASIC), Field Programmable Gate Array (FPGA) or an Erasable Programmable Logic Device (EPLD).

A further advantageous feature of the present invention is described in claim 3.

Each of said arrays corresponding to a module comprises a "number of repetitions" indicator, adapted to indicate the number of times each sub-module of said module reoccurs that number of times in the memory map of the device. The properties of those registers, which occur more, than once in the hardware device need to be incorporated in the data-structure only once. In this way, by leaving out the information, which is incorporated more than once, another substantial reduction of necessary memory space is realised.

A further characterising embodiment of the present data structure is described in claim 4.

The device properties in each of the arrays may include either one of: an initial value of a register which is the content of the register after a reset of the hardware device, read-write bits which are bits of the registers which can be read and written, unstable read-write bits i.e. bits not providing the guarantee that you read the written value and read-reset bits which are bits of the registers which are reset after read.

A further characterising embodiment of the present data structure is described in claim 5.

The data-structure is held by a storage device like such as a Random Access Memory.

A further characterising embodiment of the present data structure is described in claim 6.

The Data structure may be used for executing Generic device tests where a generic testdevice may use the information of the data-structure as input for executing access test on heterogeneous memory (e.g. Application specific Integrated circuits or Field Programmable Gate Arrays).

Another characterising embodiment of the present data structure is described in claim 7.

The access tests may be the following access tests of the ASIC include either one of Read/Write of multiple patterns to 2 registers, a data-bus test, an address-bus test, device reset test or a test of the initial values of all registers.

It is to be noticed that the term 'comprising', used in the claims, should not be interpreted as being limitative to the means listed thereafter. Thus, the scope of the expression 'a device comprising means A and B' should not be limited to devices consisting only of components A and B. It means that with respect to the present invention, the only relevant components of the device are A and B.

Similarly, it is to be noticed that the term 'coupled', also used in the claims, should not be interpreted as being limitative to direct connections only. Thus, the scope of the expression 'a device A coupled to a device B' should not be limited to devices or systems wherein an output of device A is directly connected to an input of device B. It means that there exists a path between an output of A and an input of B which may be a path including other devices or means.

The above and other objects and features of the invention will become more apparent and the invention itself will be best understood by referring to the following description of an embodiment taken in conjunction with the accompanying drawings wherein:

BRIEF DESCRIPTION OF THE DRAWINGS

FIG. 3 represents the memory map of ASIC 1;

FIG. 5 a datastructure of ASIC 1 according to the present invention.

DETAILED DESCRIPTION OF EXEMPLARY EMBODIMENTS OF THE PRESENT INVENTION

Figure 1:
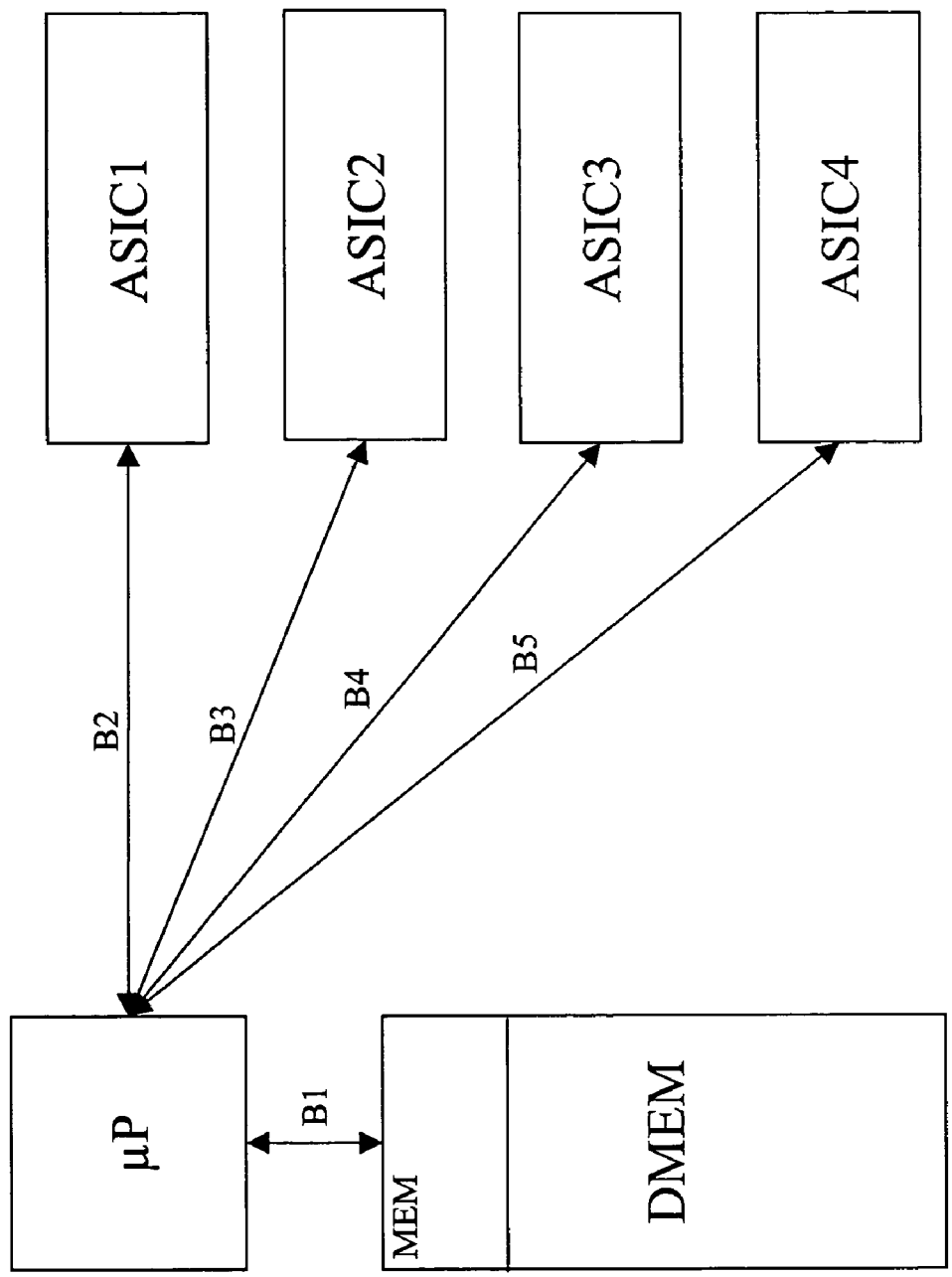
FIG. 1 represents a testing system for executing access test.

In the following paragraphs, referring to the drawings, an implementation of the present invention will be described. In the first paragraph of this description the main elements of the test environment as presented in FIG. 1 is described. In the second paragraph, all connections between the before mentioned elements and described parts are defined.

Subsequently only the structure of ASIC 1 is described as the other to be tested Application Specific Integrated Circuits ASIC2, ASIC3 and ASIC 4 have a similar structure as Application Specific Integrated Circuits ASIC1.

In the succeeding paragraph the actual execution generation of the datastructure according to the present invention is described.

The most relevant elements are a Printed circuit board PCB forming part of an electronic system. This printed circuit board PCB contains a microprocessor μP for executing the control functions of the system on the printed circuit board. Further there is a memory present on the printed circuit board comprising the program (instruction set) and data (data set) of the μP. This memory (MEM) is often Random Access memory RAM. Finally, the printed circuit board contains Application Specific Integrated Circuits ASIC1, ASIC2, ASIC3 and ASIC 4 for performing the application functions of the system.

Microprocessor μP is coupled to the memory MEM over an access bus, Bus B1 and coupled to the Application Specific Integrated Circuits ASIC1, ASIC2, ASIC3 and ASIC 4 over the respective access buses B2 . . . B5.

At first it is to be mentioned that the described Application specific Integrated Circuit ASIC 1 has a fictional functionality as in fact for explaining the invention only the structure of the Application specific Integrated Circuit is relevant. ASIC 1, as is presented in FIG. 1, comprises 2 major functional modules TABLE" and "EXTRASTUFF". Functional module "Table" further comprises seven functional sub-modules TableEntries and a register ACTIVE. Each of the functional sub-modules TABLEENTRY0 . . . 6 comprises the registers FIELD1, FIELD2 and ten times buffer registers BUFFER0 . . . 9. The functional sub-module EXTRASTUFF comprises a register Field3 and five buffer registers EBUFFER0 . . . 4.

These functional modules, i.e. the modules that have children modules, represent the internal structure (building blocks) of the ASIC, and further sub-modules, which have no children modules, are the registers of ASIC 1

Each of the modules and or sub-modules comprise the following module properties:

Offset: (in number of bytes) of this module in relation to its parent module

Size: (in number of bytes) of this module and all of its children modules without the repetition of that module. Note: In case of registers the size represents in most cases the size of the databus.

Figure 2:
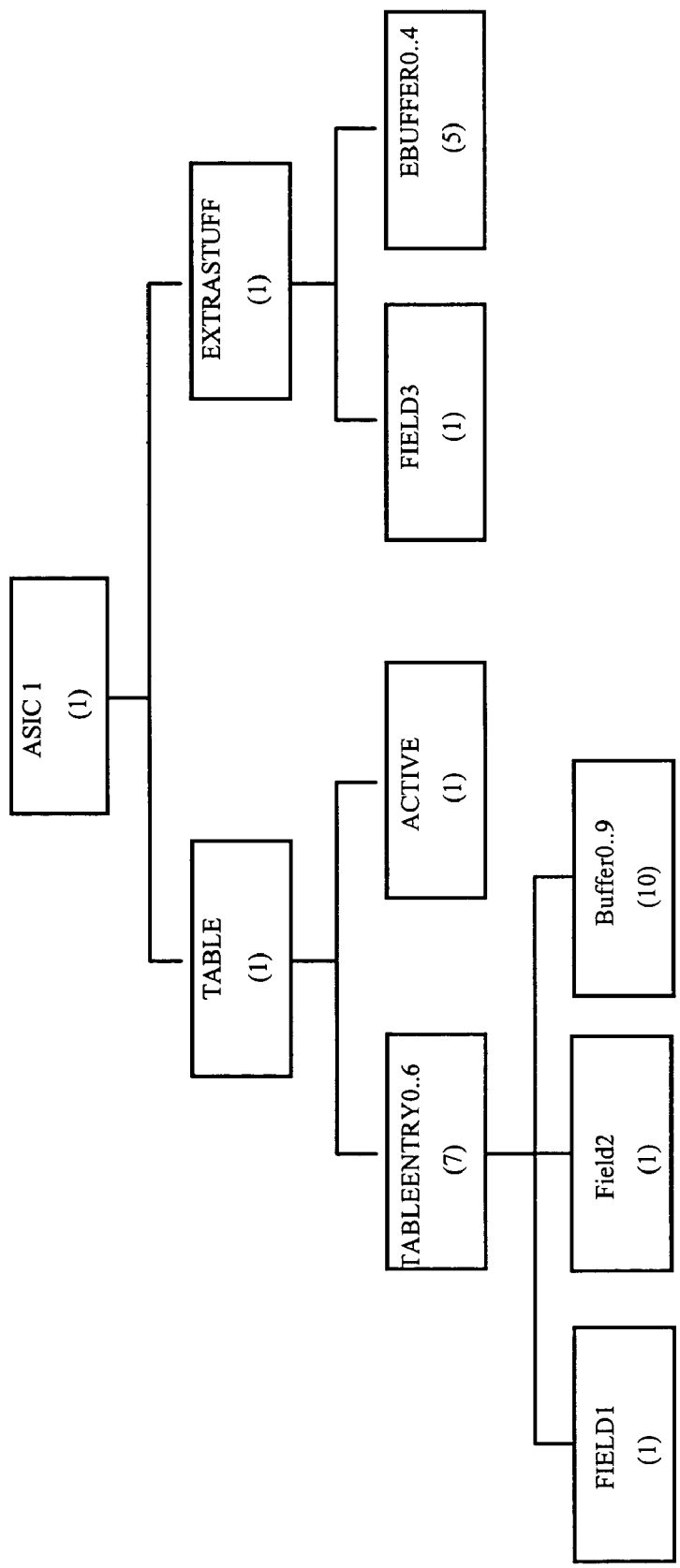
FIG. 2 represents the functional structure of ASIC1 as presented in FIG. 1.

Number of repetition indicator, indicating how many times this module or register is repeated in the memory map (at least 1). For each module, the number of repetitions indicator of that module is shown in-between brackets in FIG. 2.

The registers additionally comprise the following register properties:

The initial value: which is the default value of the register after a hardware or software reset.

read/write bits that define the bits that are read/write accessible unstable RW bit: These special RW-bits can be categorized in two types. First category is defined as those RW-bits which do not guarantee that the value which is read, is exactly the same as the one, which was written before. The second category is defined as those RW-bits which change the properties of other bits. As a first category example we could mention, the RW-bits where the written value is stored at another physical location in the ASIC then the location which is read during the read access. An other first category example, are registers which represent a counter and there is no guarantee that this counter won't change in-between the write and the read access Two examples of the second category: a RW-bit that write protect a whole block of registers, or the RW-bit that makes the ASIC go into reset.

the read reset bits: defining the bits that are reset after read access

The memory map of this ASIC 1 is presented in the table of FIG. 3. The address space of ASIC 1 starts at a given address (base-address) and occupies a given address range, i.e. when the microprocessor does an access in this address-range, ASIC1 will be triggered to terminate this read/write request. The first register FIELD1 for instance starts at offset address X of the given base-address, FIELD2 starts at offset address X+8 and so on. The unused address space is indicated in the table and furthermore marked in the table.

Figure 4:
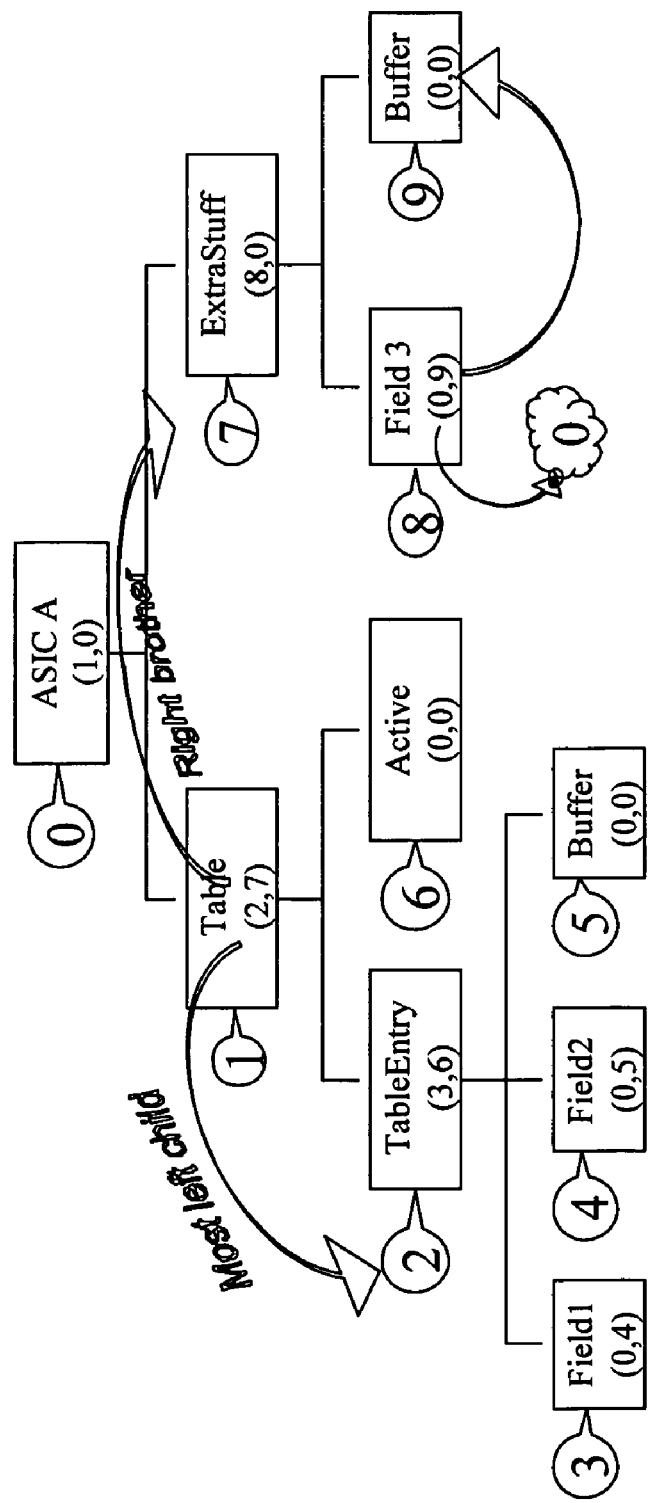
FIG. 4 represents the method structuring the datastructure of the present invention.

In order to obtain a data-structure of the present invention, that is a data-structure wherein the device properties of ASIC1 are held in a way that storage of such data-structure can be done very efficiently, the following steps are executed:

Start with the left most child of ASIC 1, which is the functional Module TABLE and put this module in the new data-structure. TABLE does not represents a register so no register properties are stored. Then go down through the structure of ASIC1 to sub-module TABLEENTRY0. The same is valid for TABLEENTRY0, which does not represent a register, so just put this module in the new data-structure leaving the register properties open. However as there are seven sub-modules the number of repetition indicator within the register properties is set at the value 7 indicating that all sub-modules depending on the module TABLEENTRY in fact are seven times available in ASIC1. Then it is proceeded with the nextfollowing left most child of submodule TABLEENTRY0 which comprises register FIELD1. This register is put in the structure together with the register properties of this register. As there is no left most child of this register the right brother of the register FIELD1 is taken into account, register FIELD2. Register Field 2 is put in the structure together with the register properties of this register. Further, as there is no left most child of this register FIELD2 the right brother of the register FIELD2 is taken into account, register BUFFER0. Register Buffer 0 is put in the structure together with the register properties of this register. As there are ten similar registers BUFFER0 . . . 9, the number of repetition indicator PPTNBR within the register properties is set at the value 10. Subsequently, there is no more right brother of these registers and it is proceeded with the right brother of module TABLE which is module EXTRASTUFF. Put the module in the new datastructure. No register is present so no register properties are stored. Then in the same way as previously described the registers FIELD3 and Buffer0 . . . 5 are together with the register properties stored in the data-structure as is presented in FIG. 4.

By going through the structure of the ASIC in above described sequence the memory of the ASIC is passed through from the lowest up to the highest memory address.

Additional to this register properties, the references of the left most child LCHILD and right most brother RBROTH of each module or sub-modules are stored in the datastructure for registrating the structure of the ASIC as shown in FIG. 5. This in order to go through the structure in same way during adding data to the datastructure as during searching for data or reading data in the datastructure.

It is to be noted that in this embodiment an Application specific Integrated Circuit is used, however this might have been any hardware device having a heterogeneous memory such as Field Programmable Gate Array (FPGA) or an Erasable Programmable Logic Device (EPLD).

It is further to be noted that the above described data-structure may be used in access test executed by the microprocessor. Because of the datastructure, these tests are making abstraction of the device under test, and are therefor generic for all devices. The single image of this test code allows the execution of such access tests on each testable device based on inputs derived from such datastructure dedicated to the device to be tested. Such an access tests of an ASIC include either one of Read/Write of multiple patterns to two registers, data-bus test, address-bus tests, device reset tests or test initial values of all registers which all are designed once.

Aside the data-structure, the following services are defined to ease the development of these generic test:

Go through the memory-map-tree and perform a predefined activity on all the leafs of the tree, i.e. go sequentially through the memory map of given device and perform the predefined activities for each register of the device.

Return a couple of register-address which refer to registers with the most RW-bits Return couples of register-address which address exactly differ in 1-bit, and which refer to registers with RW-bits. The amount of returned couples is based on the width of the address-bus.

Return the properties of a register at a given offset in the address range of the ASIC A final remark is that embodiments of the present invention are described above in terms of functional blocks. From the functional description of these blocks, given above, it will be apparent for a person skilled in the art of designing electronic devices how embodiments of these blocks can be manufactured with well-known electronic components. A detailed architecture of the contents of the functional blocks hence is not given.

While the principles of the invention have been described above in connection with specific apparatus, it is to be clearly understood that this description is made only by way of example and not as a limitation on the scope of the invention, as defined in the appended claims.

The invention claimed is:

1. A method for storing register properties of a hardware device having heterogeneous memory in a data-structure, said hardware device being built according to a structure of modules and dependent sub-modules, wherein said register properties correspond to register properties of said modules and said dependent sub-modules, wherein said method comprises:
   storing said register properties in a data-structure according to said structure of said hardware device; and
   arranging said register properties in an array for each module or dependent sub-module.

2. The method according to claim 1, wherein said array corresponding to a module of said hardware device comprises a number of repetitions indicator, adapted to indicate the number of reoccurrences of a submodule of said module.

3. The method according to claim 1, wherein said register properties in each array includes either one of an initial value of a register, the read-write bits, unstable read-write bits or read-reset bits.

4. The method according to claim 1, wherein said data structure is used in an access test executed by a generic test device.

5. The method according to claim 4, wherein said access test of an ASIC includes either one of Read/Write of multiple patterns to two registers, data-bus test, address-bus test, device reset test or test initial values of all registers.

6. A storage device comprising a data structure,
   wherein said data structure comprises register properties of a hardware device having heterogeneous memory, said hardware device having a structure of modules and dependent sub-modules, wherein said register properties correspond to register properties of said modules and said dependent sub-modules, wherein said data structure holds said register properties in a structure according to said structure of said hardware device, and wherein said register properties are arranged in an array for each module or dependent sub-module.

7. The storage device according to claim 6, wherein said array corresponding to a module of said hardware device comprises a number of repetitions indicator, adapted to indicate the number of reoccurrences of a submodule of said module.

8. The storage device according to claim 6, wherein said register properties in each array includes either one of an initial value of a register, the read-write bits, unstable read-write bits or read-reset bits.

9. The storage device according to claim 6, wherein said data structure is used in an access test executed by a generic test device.

10. The storage device according to claim 9, wherein said access test of an ASIC includes either one of Read/Write of multiple patterns to two registers, data-bus test, address-bus test, device reset test or test initial values of all registers.

* * * * *